United States Patent [19]

Schnerer et al.

[11] Patent Number: 5,492,008
[45] Date of Patent: Feb. 20, 1996

[54] METHOD AND SYSTEM FOR TESTING VEHICULAR ANTILOCK BRAKE SYSTEM COMPONENTS

[75] Inventors: Peter W. Schnerer, Dearborn Heights; Jeffrey E. Shaya, Bloomfield Hills; Brian C. Tuck, Ann Arbor, all of Mich.

[73] Assignee: Kelsey-Hayes Company, Livonia, Mich.

[21] Appl. No.: 210,709

[22] Filed: Mar. 18, 1994

[51] Int. Cl.6 ............................................. B60T 8/88
[52] U.S. Cl. ............................................. 73/129
[58] Field of Search ........................ 73/121, 129, 130; 303/92

[56] References Cited

U.S. PATENT DOCUMENTS

| | | | |
|---|---|---|---|
| 3,874,743 | 4/1975 | Fleischer et al. | 303/21 A F |
| 4,092,853 | 6/1978 | Schneider et al. | 303/92 |
| 4,106,820 | 8/1978 | Ruhnau et al. | 303/92 |
| 4,192,180 | 3/1980 | Gerstenmeier et al. | 303/92 |
| 4,493,210 | 1/1985 | Fries et al. | 303/92 |
| 4,869,558 | 9/1989 | Yoshino | 303/92 |
| 5,221,127 | 6/1993 | Ehmer et al. | 303/92 |

*Primary Examiner*—Richard Chilcot
*Assistant Examiner*—Eric S. McCall
*Attorney, Agent, or Firm*—MacMillan, Sobanski & Todd

[57] ABSTRACT

Method and system for testing components, such as a motor, of a vehicular system capable of controlling the relative slip between a vehicle wheel and a road surface, for functionality prior to performing antilock functions utilizing a progressively increasing energization duty cycle, so as to minimize perception of noise by the vehicle operator by minimizing motor energization duration and minimizing peak motor rotational speed. The method includes energizing the motor successively with a plurality of electrical signals, each electrical signal being applied to the motor for a predetermined period of time and having at least one pulse having a width which is progressively increased with respect to the width of the at least one pulse of the previous electrical signal. Each pulse has a width sufficiently long to permit motor operation to test functionality and yet sufficiently short so that the noise associated with the operating motor during this test is minimized.

13 Claims, 2 Drawing Sheets

METHOD AND SYSTEM FOR TESTING VEHICULAR ANTILOCK BRAKE SYSTEM COMPONENTS

TECHNICAL FIELD

The present invention relates to a method and system for testing the integrity of vehicular antilock brake system components.

BACKGROUND ART

Vehicle manufacturers are increasingly including antilock braking systems (ABS) on vehicles. These systems are designed to increase the ability of a vehicle operator to bring a vehicle to a stop on road surfaces, even if the surfaces are slippery.

In an ABS system, it is desirable to perform a cycle test of certain ABS system components to determine their functionality prior to a time the vehicle operator requires the system to perform antilock functions. Typically, this cycle test is performed once the vehicle ignition is turned on, or shortly thereafter once the vehicle attains a predetermined speed. Although some ABS systems rely on master cylinder pressure, other systems include a motor which drives a pump for creating system pressure. In these latter systems, it is desirable to test the functionality of the motor, as well as other system components, such as solenoid valve coils.

Referring now to FIG. 1, there is shown an existing methodology for testing the motor of an ABS system. As shown, the motor is energized with a single step input electrical signal V(t) having a duration of approximately 0.5 S after which the excitation is removed. If the motor is not functional (e.g. rotor locked), the signal V(t) will substantially instantaneously return to zero at $t_2$ as shown in FIG. 1. If, however, the motor is operational, application of V(t) across the motor will result in rotation of the motor rotor. As a result, the motor generates what is known as a back-emf after removal of the excitation voltage, and the signal will decay to zero, as shown by the dotted line. As a result, prior art methodologies look for the existence of this back-emf as an indication of the functionality of the motor.

When the motor is energized with V(t) and the pump is driven, there is an accompanying audible noise emitted which may be heard by the vehicle operator. The perception of this noise by the vehicle operator is undesirable.

As such, there is a need for an ignition cycle test that satisfactorily tests the appropriate ABS components, such as the pump motor, while minimizing motor rotational speed and motor operating time so as to minimize perception by the vehicle operator of the noise accompanying motor operation.

DISCLOSURE OF THE INVENTION

It is, therefore, an object of the present invention to provide an ignition cycle test for a vehicular ABS which satisfactorily tests the appropriate ABS components, such as the pump motor, with minimal noise generated by the operating motor.

It is a further object of the present invention to provide a quiet ignition cycle test for a vehicular ABS which satisfactorily tests the main power relay, the solenoid coil valves, and the pump motor of the ABS.

In carrying out the above objects and other objects and features of the present invention, a method is provided, for use with a vehicle having a system capable of controlling the relative slip between at least one wheel of the vehicle and a road surface, the system including an electronic control unit and a pump assembly including a motor, the motor having a rotor and a winding, the method for testing the functionality of the motor. The method comprises energizing the motor successively with a plurality of electrical signals, each electrical signal being applied to the motor and having at least one pulse having a width which is progressively increased with respect to the width of the at least one pulse of the previous electrical signal, the at least one pulse being sufficiently long to permit motor operation to test functionality but which is sufficiently short so that the noise associated with the operating motor during this test is reduced.

In a preferred embodiment, energization of the motor is ceased if a back-emf is generated across the motor winding in response to energization of the motor by an electrical signal.

A system is also provided for carrying out the method.

The advantages accruing to the present invention are numerous. For example, the methodology of the present invention provides a quiet ignition cycle test which satisfactorily tests the appropriate ABS components while minimizing the time the motor is operating and minimizing the peak rotational speed of the motor during the test, so as to minimize the perception of noise by the vehicle operator.

The above objects and other objects, features, and advantages of the present invention will be readily appreciated by one of ordinary skill in the art from the following detailed description of the best mode for carrying out the invention when taken in connection with the accompanying drawings.

BEST MODE FOR CARRYING OUT THE INVENTION

Figure 1:
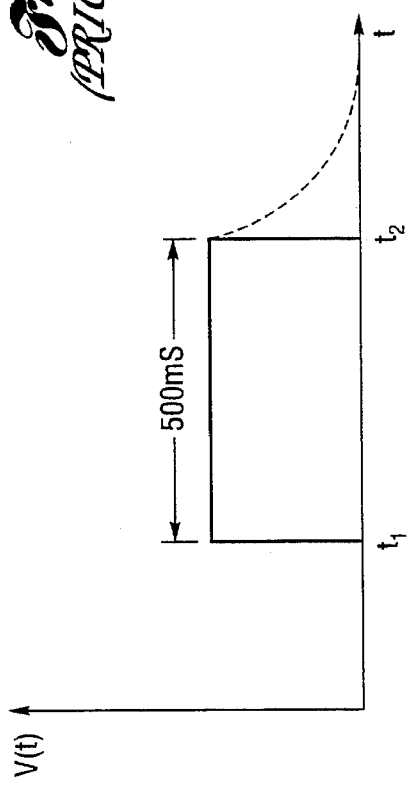
FIG. 1 is an illustration of a first prior art ignition cycle test signal for a vehicular ABS.
Figure 2:
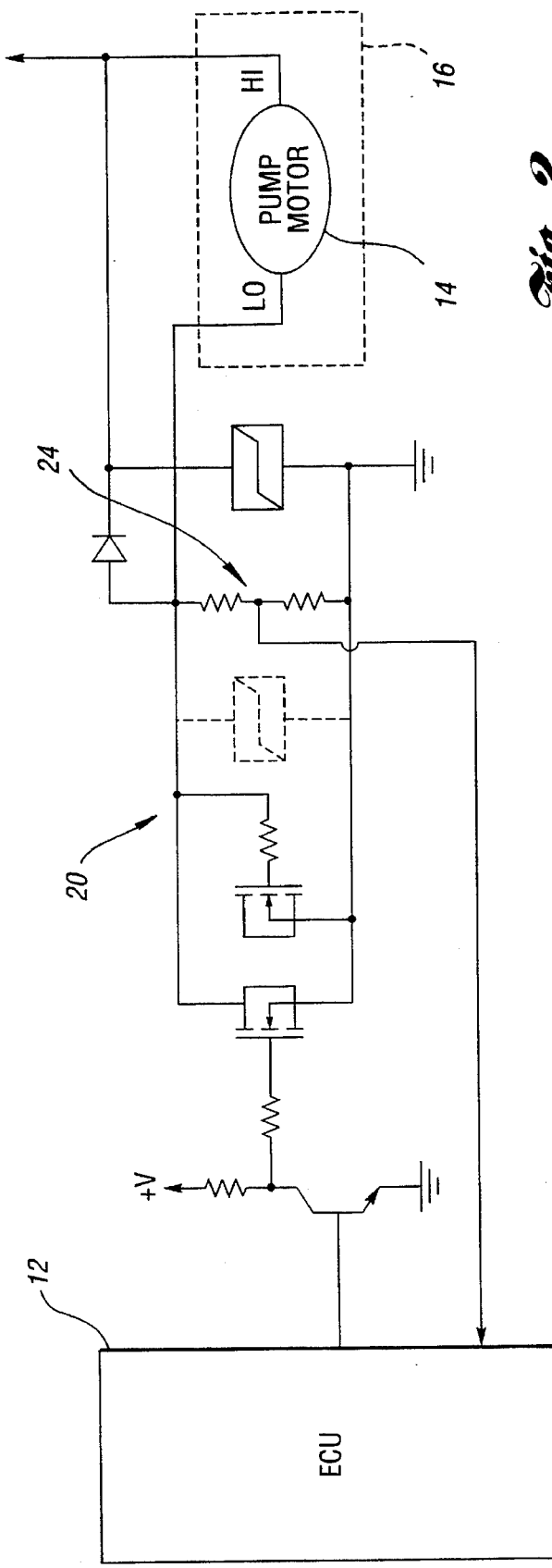
FIG. 2 is a schematic illustration of a circuit arrangement for carrying out the methodology of the present invention.

Referring now to FIG. 2, there is shown a schematic diagram of a circuit arrangement including antilock brake system (ABS) componentry shown generally by reference numeral 20 for use with the present invention. As shown, the circuit arrangement 20 includes an electronic control unit (ECU) 12 in electrical communication with a pump motor 14 of a pump assembly 16. The motor 14 includes an output shaft (not specifically illustrated) which is mechanically coupled to a pump.

For purposes of this discussion, the ECU 12 includes known electronic componentry, such as a commercially available microprocessor, as well as random access and read only memories, and executes software, permitting the ECU to control the ABS componentry according to the present invention. Once the motor 14 is energized by the ECU 12, the motor output shaft drives the pump, which in turn provides pressure for the ABS. The other hardware typically associated with an ABS and well-known in the art, such as brake fluid conduits, brake valves, vehicle wheels, wheel speed sensors, and the like have been omitted for the sake of clarity.

Figure 3:
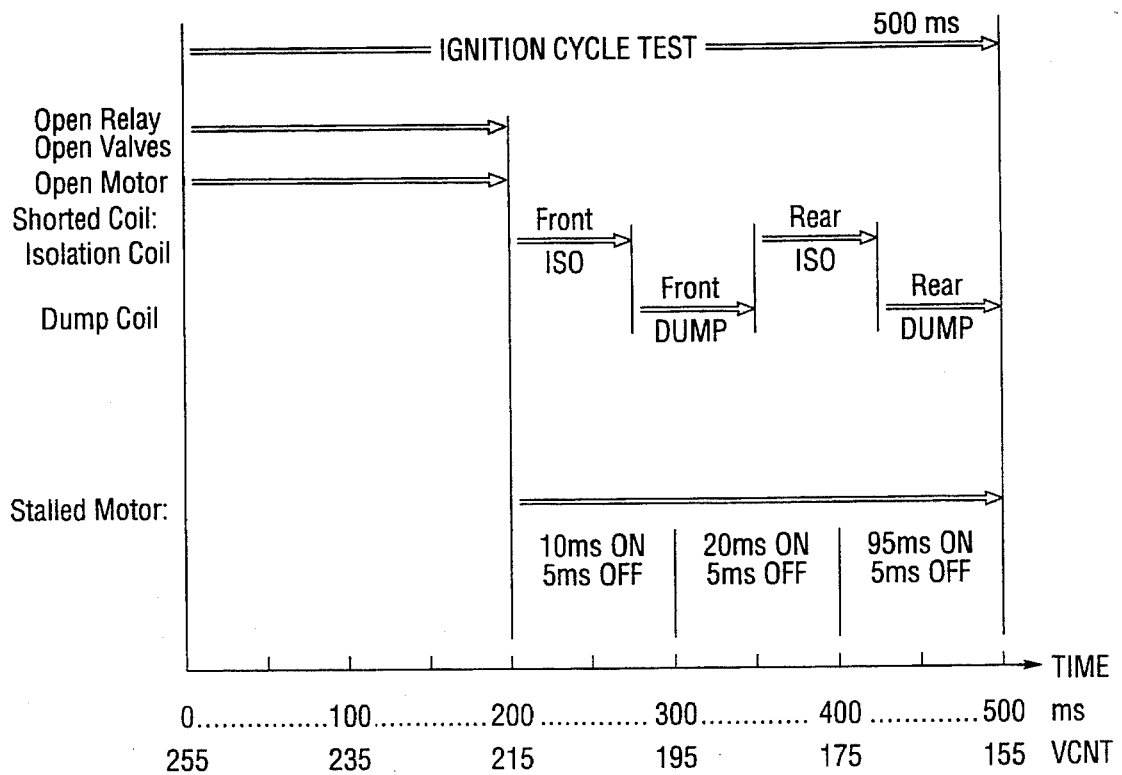
FIG. 3 is an illustration of the quiet ignition cycle test sequence according to the present invention.

Referring now to FIG. 3, there is illustrated an ignition cycle test sequence. The ignition cycle test is executed when the vehicle first moves after an ignition turn-on. As shown, the test comprises a sequence of energizing various ABS components to verify their functionality before the system is needed to perform antilock functions. The test includes a functionality test of the main power relay to check for both an open and/or a shorted relay condition, in preparation for energizing various solenoid coils and the pump motor. As shown, additional functional tests are performed to check for an open motor condition, and to check for both open and/or a shorted solenoid valve (e.g. isolation and dump) coils condition.

With continuing reference to FIG. 3, according to the present invention, a stalled motor test is performed as part of the ignition cycle test. Generally, the principle of this test is to observe whether or not an adequate back-EMF can be generated across the motor winding. The back-EMF is taken as indication that the rotor is spinning properly.

Referring to FIGS. 2 and 3, during the test vehicle battery voltage is applied to the high side of the pump motor 14 in the hydraulic assembly through a power relay (not specifically illustrated), the contacts of which are allowed to debounce prior to execution of the motor test. The motor is driven by turning on a pair of ECU output driver transistors to connect the low side of the motor winding to ground. A relatively high impedance feedback path including a voltage divider operating as a voltage sense to the ECU, shown generally by reference numeral 24, runs from the low side of the motor to the ECU 12. During the time that the motor is driven, feedback voltage is very low (scaled down from the voltage drop across the pair of motor driver transistors). If the rotor is locked, voltage at the low side of the motor would immediately rise to approximately vehicle battery voltage when the motor command is ended. If the motor rotor is turning, the presence of any back-EMF across the motor winding drives DC potential at the low side of the motor down below the battery voltage. If the rotor is turning adequately, the feedback voltage will be below the switching threshold at the input to the microprocessor.

Figure 4:
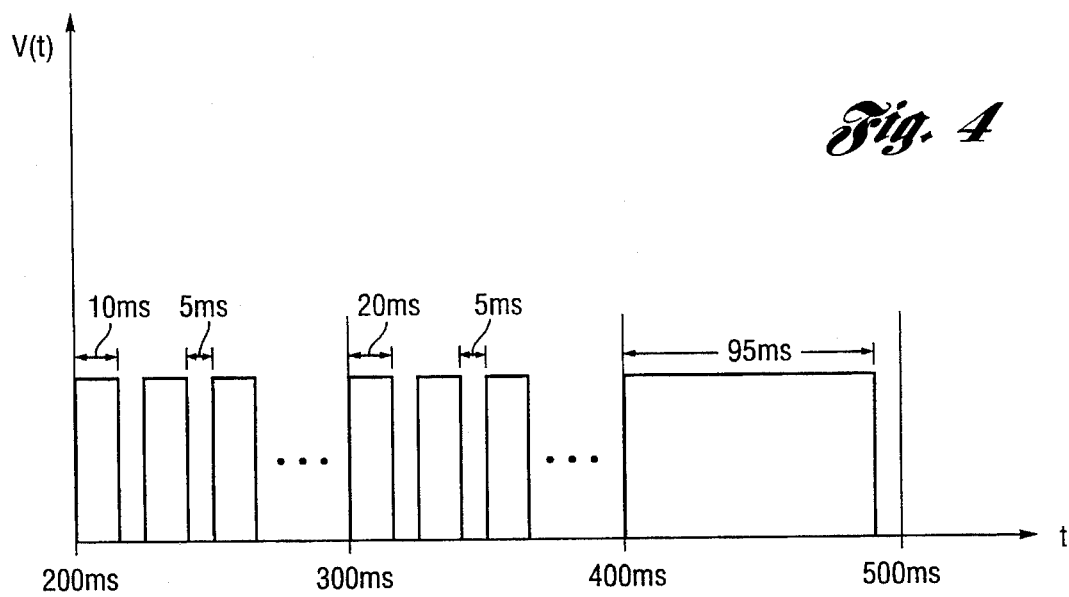
FIG. 4 is an illustration of a stalled motor test according to the present invention.

With reference now to FIGS. 3 and 4, in the preferred embodiment, a 90 mS initial test is executed utilizing a first electrical signal to attempt to identify a turning rotor quickly with minimal motor run time and minimal peak rotational speed. In this initial phase, the motor is turned on with a 10 mS pulse, then off for 5 mS during which a check for back-emf across the winding is made. This 15 mS cycle is repeated 6 times. At normal temperatures, the back-emf will be identified after 60 mS to 90 mS and the test will be complete. If an acceptable back-emf is generated, the test is ceased. If, however, the back-emf is not identified during the 90 mS initial phase, the second phase of the stalled motor ignition cycle test is executed wherein the motor is energized with a second electrical signal. It should be noted that the pulse width should be selected based on the motor characteristics. For example, as motor inertia increases, the energization pulse width would also increase.

As shown in FIG. 3, the second phase involves operating the motor with a second electrical signal having a first progressively increased duty cycle for 100 mS. As best shown in FIG. 4, in the second phase, the motor is energized with a 20 mS pulse, then deenergized for 5 mS during which a check for back-emf across the winding is made. This 25 mS cycle is repeated 4 times. Again, at normal temperatures, the back-emf will be identified after 60 mS to 90 mS and the test will be complete. If an acceptable back-emf is generate, the test is ceased. If, however, the back-emf is not identified during the 100 mS second phase, a third phase of the stalled motor ignition cycle test is executed.

In the preferred embodiment, the third phase involves operating the motor at a second progressively increased duty cycle for 100 mS, as shown in FIG. 3. In the third phase, the motor is energized with a third electrical signal for a period of 95 mS, then deenergized for 5 mS to check the back-emf, as shown in FIG. 4. This cycle is not repeated. If the back-emf is not identified during this 100 mS third phase, no further testing of the motor is initiated and a stalled motor is identified. It should be appreciated that all three phases are sufficiently short in duration so that the perception of noise associated with energizing the motor is minimized, unlike existing methodologies, while still capable of satisfactorily testing the operational status of the motor.

Monitoring the nominally slowly varying feedback voltage is complicated by superimposed AC components caused by commutator segmentation and brush electrical noise. If the feedback voltage were checked only every 5 ms after the motor command ends, it is possible that each back-emf check would coincide with positive AC so that acceptably low feedback voltage never would be observed before the motor slowed down too much. This possibility is avoided by checking the feedback voltage every 0.012 mS during the period of the 5 mS computation loop that is left over after all other necessary computations have been performed. Motor operation is considered to be acceptable and the test is ended the first time that the expected low feedback voltage is observed. A stalled motor is identified only if the test continues for 100 mS past end of the motor command with the proper feedback voltage never having been observed.

A stalled motor will thus be identified for anything that keeps motor feedback voltage high when it is expected to be driven by back-EMF across the rotor winding of the coasting motor. This situation could be caused by a seized motor or pump, as well as a failure in the motor driver circuit, a short circuit in the motor winding, or a short to a high voltage point in the motor feedback to the microprocessor.

It should be understood that an appropriate diagnostic response may be initiated by the ECU and provided to the vehicle operator in the event any or all of the relay, valve and/or motor tests described above indicates an inoperative or failed component. Such a diagnostic response may include, for example, illuminating a visual indicator and/or activating an audible indicator.

It should be noted that although the above discussion referred only to an antilock brake system, the present invention is equally applicable to any system capable of controlling the relative slip between at least one of the wheels of the vehicle and a road surface, such as a traction control system.

It should also be noted that an additional methodology for testing the functionality of the pump motor could include energizing the motor with a plurality of multi-pulse electrical signals wherein each pulse of each electrical signal is substantially identical, but long enough to adequately test for motor functionality while being short enough so that the perception of the noise is minimized. For example, instead of a sequence of electrical signals having increasing pulses such as that shown in FIG. 4, the sequence of electrical signals may be such that each electrical pulse of each electrical signal has a duration of, for example, 20 mS followed by a delay period of, for example, 5 mS. As noted above, the actual pulse width would be based on the motor characteristics.

It is understood, of course, that while the form of the invention herein shown and described constitutes the preferred embodiment of the invention, it is not intended to illustrate all possible forms thereof. It will also be understood that the words used are words of description rather than limitation, and that various changes may be made without departing from the spirit and scope of the invention as disclosed.

What is claimed is:

1. For use with a vehicle having a system for controlling a relative slip between at least one vehicle wheel and a road surface, the system including an electronic control unit and a pump assembly including a motor having a winding, a method for testing a functionality of the motor comprising:

energizing the motor successively with a plurality of electrical signals, each electrical signal having at least one pulse having a width which is progressively increased with respect to the width of the at least one pulse of a previous electrical signal, the at least one pulse having a duration sufficient to permit motor operation to test the functionality and to reduce noise associated with the operating motor during this test, wherein energization of the motor is ceased if such energization generates a back-emf across the motor winding indicative of a functional motor; and measuring the back-emf across the motor winding after each pulse to the motor is applied.

2. The method of claim 1 wherein the motor is energized with at least first and second successive electrical signals, and wherein the pulse width of each of the plurality of pulses of the second electrical signal is at least twice the width of the pulses of the first electrical signal.

3. The method of claim 2 wherein the motor is energized with three successive electrical signals, and wherein a third electrical signal has a single pulse for energizing the motor.

4. For use with a vehicle having a system for controlling a relative slip between at least one vehicle wheel and a road surface, the system including an electronic control unit and a pump assembly including a motor having a winding, a method for testing a functionality of the motor comprising:

energizing the motor successively with a plurality of electrical signals, each electrical signal having at least one pulse having a width which is progressively increased with respect to the width of the at least one pulse of a previous electrical signal, the at least one pulse having a duration sufficient to permit motor operation to test the functionality and to reduce noise associated with the operating motor during this test;

measuring a back-emf generated across the motor winding in response to each pulse of each electrical signal; and terminating the energization of the motor upon the measurement of a back-emf indicative of a functional motor.

5. The method of claim 4 wherein the motor is energized with at least first and second successive electrical signals, and wherein the pulse width of each of the plurality of pulses of the second electrical signal is an least twice the width of the pulses of the first electrical signal.

6. The method of claim 5 wherein the motor is energized with three successive electrical signals, and wherein a third electrical signal has a single pulse for energizing the motor.

7. For use with a vehicle having a system for controlling a relative slip between at least one vehicle wheel and a road surface, the system including an electronic control unit and a pump assembly including a motor having a winding, a method for testing a functionality of the motor comprising:

energizing the motor with a first electrical signal having a plurality of pulses, each pulse having a first pulse width;

determining whether the motor was operated during energization by the first electrical signal;

energizing the motor with a second electrical signal having a plurality of pulses if the motor was not operated during energization by the first electrical signal, each pulse of the second electrical signal having a second pulse width progressively increased from the first pulse width;

determining whether the motor was operated during energization by the second electrical signal;

energizing the motor with a third electrical signal having a single pulse if the motor was not operated during energization by the second electrical signal, the single pulse having a width progressively increased from the second pulse width, each of the pulses of each electrical signal having a duration sufficient to permit motor operation to test the functionality and to reduce noise associated with the operating motor during this test;

determining whether the motor was operated in response to the third electrical signal; and identifying an inoperative motor if the motor was not operated by the third electrical signal.

8. The method of claim 7 wherein determining whether the motor was operated during energization by an electrical signal comprises monitoring the motor winding so as to determine whether a back-emf indicative of a functional motor was generated across the motor winding in response to the motor being energized by the electrical signal.

9. The method of claim 7 wherein the pulse width of each of the plurality of pulses of the second electrical signal is at least twice the width of the pulses of the first electrical signal, and wherein the third electrical signal has a single pulse for energizing the motor.

10. For use with a vehicle having a system for controlling a relative slip between at least one vehicle wheel and a road surface, the system including an electronic control unit and a pump assembly including a motor having a winding, a system for testing a functionality of the motor comprising:

a controller for energizing the motor successively with a plurality of electrical signals, each electrical signal having at least one pulse having a width which is progressively increased with respect to the width of the at least one pulse of a previous electrical signal, the at least one pulse having a duration sufficient to permit motor operation to test the functionality and to reduce noise associated with the operating motor during this test; and means for measuring a back-emf generated across the motor winding;

wherein the controller ceases to energize the motor with electrical signals if a back-emf indicative of a functional motor is generated across the motor winding in response to energization of the motor by an electrical signal.

11. The system of claim 10 wherein the back-emf across the motor winding is measured after each pulse to the motor is applied.

12. The system of claim 10 wherein the motor is energized with at least first and second successive electrical signals, and wherein the pulse width of each of the plurality of pulses of the second electrical signal is at least twice the width of the pulses of the first electrical signal.

13. The system of claim 12 wherein the motor is energized with three successive electrical signals, and wherein the third electrical signal has a single pulse for energizing the motor.

* * * * *